United States Patent
Hetzel et al.

(10) Patent No.: US 8,072,085 B2
(45) Date of Patent: Dec. 6, 2011

(54) SEMICONDUCTOR DEVICE WITH PLASTIC PACKAGE MOLDING COMPOUND, SEMICONDUCTOR CHIP AND LEADFRAME AND METHOD FOR PRODUCING THE SAME

(75) Inventors: Wolfgang Hetzel, Nattheim (DE); Jochen Thomas, München (DE)

(73) Assignee: Qimonda AG, Munich (DE)

( * ) Notice: Subject to any disclaimer, the term of this patent is extended or adjusted under 35 U.S.C. 154(b) by 912 days.

(21) Appl. No.: 10/577,173

(22) PCT Filed: Oct. 25, 2004

(86) PCT No.: PCT/DE2004/002374
§ 371 (c)(1),
(2), (4) Date: Oct. 27, 2009

(87) PCT Pub. No.: WO2005/045926
PCT Pub. Date: May 19, 2005

(65) Prior Publication Data
US 2010/0032817 A1 Feb. 11, 2010

(30) Foreign Application Priority Data
Oct. 27, 2003 (DE) .................................. 103 50 239

(51) Int. Cl.
*H01L 23/28* (2006.01)
*H01L 23/29* (2006.01)
*H01L 23/495* (2006.01)

(52) U.S. Cl. ..................... 257/787; 257/666; 257/790

(58) Field of Classification Search .................. 257/666, 257/787, 790
See application file for complete search history.

(56) References Cited

U.S. PATENT DOCUMENTS

| | | | |
|---|---|---|---|
| 4,866,506 A * | 9/1989 | Nambu et al. | 257/667 |
| 5,059,559 A * | 10/1991 | Takahashi et al. | 228/105 |
| 5,874,784 A | 2/1999 | Aoki et al. | |
| 6,054,755 A * | 4/2000 | Takamichi et al. | 257/667 |
| 6,310,390 B1 * | 10/2001 | Moden | 257/668 |
| 6,429,372 B1 | 8/2002 | Taguchi et al. | |
| 6,445,060 B1 * | 9/2002 | Courtenay et al. | 257/666 |
| 6,700,188 B2 * | 3/2004 | Lin | 257/684 |
| 7,012,324 B2 * | 3/2006 | Li et al. | 257/676 |
| 2001/0022404 A1 | 9/2001 | Yamamoto et al. | |
| 2002/0030253 A1 * | 3/2002 | Grigg et al. | 257/666 |
| 2002/0045294 A1 | 4/2002 | Barrett et al. | |
| 2002/0056561 A1 | 5/2002 | Yaguchi et al. | |
| 2002/0137257 A1 | 9/2002 | Huang et al. | |
| 2003/0111738 A1 | 6/2003 | Buschbom | |
| 2004/0032014 A1 | 2/2004 | Lai et al. | |
| 2005/0082649 A1 * | 4/2005 | Masumoto | 257/678 |

FOREIGN PATENT DOCUMENTS

| | | |
|---|---|---|
| JP | 1264230 | 10/1989 |
| JP | 2003-258158 | 12/2003 |

* cited by examiner

*Primary Examiner* — James M Mitchell
(74) *Attorney, Agent, or Firm* — Dicke, Billig & Czaja, P.L.L.C.

(57) ABSTRACT

A semiconductor device with a plastic package molding compound, a semiconductor chip and a leadframe is disclosed. In one embodiment, the semiconductor chip is embedded in a plastic package molding compound. The upper side of the semiconductor chip and the plastic package molding compound are arranged on a leadframe. Arranged between the leadframe and the plastic package molding compound with the semiconductor chip is an elastic adhesive layer for the mechanical decoupling of an upper region from a lower region of the semiconductor device.

16 Claims, 2 Drawing Sheets

SEMICONDUCTOR DEVICE WITH PLASTIC PACKAGE MOLDING COMPOUND, SEMICONDUCTOR CHIP AND LEADFRAME AND METHOD FOR PRODUCING THE SAME

CROSS REFERENCE TO RELATED APPLICATION

This Utility patent application claims the benefit of the filing date of German Application No. DE 103 50 239.4. Oct. 27, 2003, and International Application No. PCT/DE2004/002374. filed Oct. 25, 2004, both of which are herein incorporated by reference.

FIELD OF INVENTION

The invention relates to a semiconductor device with a plastic package molding compound, a semiconductor chip and a leadframe and to a method for producing the same. The semiconductor chip is embedded with one of its upper sides and its peripheral sides in the plastic package molding compound. The other upper side of the semiconductor chip is arranged on the leadframe. The upper side of the leadframe that is not covered by the semiconductor chip is covered by the plastic package molding compound.

BACKGROUND

Such a construction of a semiconductor device is held together by the fixing plastic package molding compound, which at the same time embeds the semiconductor chip and is firmly anchored on the leadframe. The semiconductor chip is additionally fixed in its position on the leadframe by means of an adhesive layer, the adhesive layer ensuring that the semiconductor chip is neither displaced during the application of the plastic package molding compound nor lifts off from the leadframe. At the same time, the adhesive layer under the semiconductor chip acts as a stress equalizing layer when thermal stresses occur.

However, the actual equalizing effect of the adhesive layer under the semiconductor chip is not fully realized, since it is enclosed on all sides by the rigid plastic package molding compound. Consequently, the adhesive layer, which is restricted to the surface of the semiconductor chip, is also laterally fixed and cannot completely equalize the difference in stress between the leadframe and the semiconductor chip that is caused by the different coefficients of expansion. Consequently, in temperature cycle tests virtually the entire stress between the semiconductor chip and the circuit substrate is passed on to the external contacts of the semiconductor device, which can lead to considerable failures.

In spite of the equalization of thermal stresses by the adhesive layer between the semiconductor chip and the leadframe, microcracks can also occur in the case of such a construction of a semiconductor device, in particular at the boundary layer between the plastic package molding compound and the upper sides of the leadframe. It has previously been attempted to prevent such microcracks, which in an extreme case can lead to delamination, by strengthening the anchorages between the two materials. For this purpose, porous ceramic or metallic coatings have been developed for the upper side of the leadframe and deposited on the leadframe in order to improve the anchorage with the plastic package molding compound. Nevertheless, it is observed that the stronger anchorage has the effect that the formation of microcracks is shifted into regions above the anchoring layer but cannot be completely suppressed.

For these and other reasons there is a need for the present invention.

SUMMARY

In one embodiment, the present invention provides a semiconductor device with a plastic package molding compound, a semiconductor chip and a leadframe that solves the problems of current semiconductor devices in the transitional region from the leadframe to the plastic package molding compound and at the transition to the semiconductor chip material and makes an improved yield possible after a temperature cycle test.

The invention provides a semiconductor device with a plastic package molding compound, a semiconductor chip and a leadframe in which the semiconductor chip is embedded with one of its upper sides and its peripheral sides in the plastic package molding compound. The other of the two upper sides is surface-mounted on an upper side of the leadframe. The region of the upper side of the leadframe that is not covered by the semiconductor chip is covered by the plastic package molding compound. Arranged between the plastic package molding compound and the leadframe, and between the semiconductor chip and the leadframe, on the upper side of the leadframe is a continuous, elastic adhesive layer.

Consequently, in the case of a semiconductor device according to the invention, intensive anchorage of the plastic package molding compound with the embedded semiconductor chip on the leadframe is not an objective, but rather the two regions are decoupled by the continuous elastic adhesive layer arranged between them. With devices of a conventional type, it has been found in temperature cycle tests that the boundary layer between these regions of the plastic package molding compound with the semiconductor chip and of the leadframe, which expand differently, are subjected to extreme loading and have the tendency for microcracks to form, which is overcome by the device according to the invention. In an extreme case, these microcracks lead to delamination, but not in the case of the device according to the invention. Conventional devices at least provide conducive conditions for the penetration of moisture into the microcracks at high temperature, the moisture which has penetrated then being capable of rupturing the device at the extreme cooling temperatures of the temperature cycle test, which in the case of the device according to the invention is prevented by the adhesive layer.

One advantage of the semiconductor device according to the invention is that, by contrast with the tendency to strengthen the anchorage between the different materials and constantly improve the mechanical coupling and increase the rigidity of the device, in the case of the semiconductor device according to the invention the anchorage or the coupling of the upper side of the leadframe to the plastic package molding compound is relaxed, or eliminated completely, by a rubber-elastic adhesive layer.

Consequently, in the case of the semiconductor device according to the invention, a decoupling of the expansion behavior of the components on the upper side of the leadframe from the material of the leadframe is created, which leads to the formation of microcracks being reduced and the risk of delamination being avoided. It is of particular advantage if an elastomer-based adhesive layer is arranged on the upper side of the leadframe, since such elastomers can tolerate a great difference in the expansion behavior of the materials without microcracks forming or delamination occurring. Adhesive gel is also a means that can be successfully used to realize such an adhesive layer. Silicone-based elastomers are extremely significant in this respect.

In one embodiment of the invention it is provided that the peripheral regions of the semiconductor device are free of the elastic adhesive layer. This region that is free of the elastic adhesive layer is minimized as far as possible in its area requirement and surrounds the entire periphery of the device.

This embodiment of the invention is accompanied by the advantage that the adhesive compound of the adhesive layer does not lead to soiling of the dividing tools during the singulating of semiconductor devices from a panel. This is especially since adhesive compounds on the dividing tools can lead to considerable problems in fabrication, which is not permissible when they are used in mass production. Consequently, keeping the peripheral regions of the semiconductor device free of the elastic adhesive layer has a not inconsiderable advantage for fabrication. However, keeping them free in this way can have the effect that, in the peripheral regions, microcracks then occur to an increased extent in the plastic package molding compound, which then rests in the peripheral regions on the leadframe without a decoupling elastic adhesive layer.

A further embodiment of the invention provides that the peripheral regions of the semiconductor device kept free of the adhesive layer have elastic metal layers. Such metal layers may be made to match one another in such a way that a stress reduction takes place in them, without leading to the formation of microcracks. For this purpose, a copper layer which comprises a copper alloy may be arranged on the leadframe, and a gold layer of a gold alloy may be deposited on top of it in the peripheral region, elastic deformations of the soft metals serving to reduce stresses without microcrack formations occurring. Furthermore, the anchorage of the plastic package molding compound on the gold coating is minimal, so that, apart from a ductile displacement, a deliberate microgap formation can occur, which however then does not cause any microcracks in the plastic package molding compound.

Instead of a gold layer, silver or aluminum layers may also be deposited on the copper layer, since these metals also comprise alloys which are extremely ductile and can consequently yield in a ductile manner under stress loading without microcracks forming. For this purpose, the width of the metal layers in the peripheral regions of the semiconductor device may be adapted to the width of sawing tracks in such a way that the elastic adhesive layer is not exposed to the sawing process in the production of the peripheral sides of the semiconductor device. For this purpose, the ratio between the width of the metal layer and the width of the sawing tracks preferably lies between 1.2 and 3. In this respect, allowance is made for the adjustment tolerance in the alignment for the sawing process and the sawing tolerance, in order to determine the ratio between the width of the metal layers and the width of the sawing tracks more precisely.

A further embodiment of the invention relates to a panel which has device positions with semiconductor devices arranged in rows and columns, as described above. Such a panel is in practice a composite sheet comprising the plastic package molding compound, the semiconductor chips and the leadframe which has semiconductor devices arranged in a number of device positions. Such a panel may take the form of a rectangular sheet or be modelled on a semiconductor wafer, so that customary automatic dividing machines can be used for dividing the wafer.

A method for producing such a panel with a plastic package molding compound, semiconductor chips and a leadframe in a number of semiconductor device positions has the following method process. Firstly, a leadframe with device positions arranged in rows and/or columns is produced. Such a leadframe may comprise a sheet of insulating plastic which has on the underside of the leadframe a wiring structure, which for its part has wiring leads and external contact areas.

The wiring leads in this case lead to bonding fingers, which are arranged at the periphery of a central opening in the leadframe. The central opening makes access possible to contact areas of a semiconductor device which is aligned on the basis of this opening. However, even before such a semiconductor chip is applied to the opening, an elastic adhesive layer, covering both the region of the intended semiconductor chip and the region of the intended plastic package molding compound on an upper side of the leadframe in the device positions. Subsequently, semiconductor chips are aligned with the adhesive layer in the device positions and adhesively attached.

In the event that the circuit substrate has a central opening, it is ensured when adhesively attaching the semiconductor chip that contact areas of the axial upper side of the semiconductor chip which are arranged in bonding channels are aligned in a way corresponding to the opening in the leadframe in the device positions.

Subsequently, electrical connections are established between contact areas of the semiconductor chip and the leadframe in the device positions. In the case of a central bonding channel, the contact areas, which are arranged for example in two rows in the central bonding channel, may be connected to the bonding fingers of the wiring structure on the underside of the leadframe by means of bonding wires. Subsequently, the plastic package molding compound is applied to the adhesive layer while embedding the semiconductor chips and while forming a panel with a number of semiconductor device positions. In the case of a bonding channel opening on the rear side of the leadframe, this may also be sealed when a plastic package molding compound is applied.

This method has the advantage that individual method process can be carried out simultaneously in parallel for a number of semiconductor device positions. In addition, the method has the advantage that it can be used to create a panel of which the upper region, that is the region of the plastic package molding compound and the semiconductor chips, is decoupled from its lower region, the leadframe with bonding connections, in the respective expansion behavior.

For the production of a semiconductor device, it is merely necessary to divide the panel up into individual semiconductor devices along the dividing tracks or sawing tracks, the semiconductor devices still not having external contacts. The external contacts may be applied both before the dividing up of the panel and after the dividing up of the panel to the respective external contact areas of the wiring structure on the underside of the leadframe.

If the external contacts are applied before the dividing up of the panel, this has the advantage that the external contacts can also be applied to the external contact areas and connected to the external contact areas simultaneously for a number of semiconductor devices in one method step. In the case of a method in which it envisaged only to divide the devices in each device position and subsequently apply external contacts to external contact areas, the advantage is obtained that external contacts are to be applied only to the semiconductor devices which have previously not been marked as defective devices during the functional test of the panel.

In a further example of how the method is carried out, it is provided that a pattern of metal layers is applied to the leadframe before the application of the adhesive layer. This pattern covers on the one hand the sawing tracks with the metal layers and on the other hand the peripheral regions of each device position. In this case, the width of the metal layers is in a ratio to the width of the sawing tracks of between approximately 1.2 and 3. This ratio can be adapted precisely to the tolerances of the sawing track widths and the tolerances of the means allowing alignment of the panel in the preparation for sawing. If the tolerances are relatively narrow, it is possible to go back to the minimum width of 1.2 in the ratio to the sawing track width, and if the tolerances are correspondingly high, widths of up to three times the sawing track width may be provided.

These metal layers on the one hand have the advantage that they can follow the thermal expansions of the components of the semiconductor device and thereby change in a ductile manner without forming microcracks or initiating microgaps in a desired peripheral region. Furthermore, the application of the metal layers has the advantage that sawing tools are not soiled by the rubber-elastic material of the adhesive layer, and consequently last through longer servicing intervals, which considerably brings down fabrication costs.

To sum up, it can be stated that the basic idea of the invention of extending the adhesive layer to the periphery of the package, or at most taking it up to the singulation tolerance of a sawing track, is accompanied by the advantage that the elastic adhesive layer, which reduces thermal stresses, is no longer restricted in its expansion behavior by the plastic package molding compound. If, for example, a layer of gold is additionally introduced into the boundary layer in the peripheral regions of the semiconductor device, the region of the plastic package molding compound with the semiconductor chip is likewise mechanically decoupled from the leadframe. This is especially since a layer of gold has lower adhesion in relation to the plastic package molding compound than the otherwise customary solder resist masks or anchorage coatings of conventional devices.

Consequently, a complete path for decoupling between the semiconductor chip and in the plastic package molding compound the leadframe can be achieved by the following measures according to the invention:

1. The geometry of the adhesive layer is designed in such a way that a defined mold periphery remains, which ensures formation of a gap between the metal layers and the plastic package molding compound, the adhesive layer being taken up to the periphery of the package as far as the singulation tolerance.

2. A gold periphery is placed on the upper side of the leadframe in the peripheral region, applied to a copper layer or to a solder layer which are present in any case in the production of the leadframe. Since the plastic package molding compound adheres poorly on the gold, local points of reduced adhesion are obtained, and consequently a desired gap between the layer of gold and the plastic package molding compound.

Consequently, the semiconductor chip with the plastic package molding compound is decoupled virtually completely from the leadframe by this invention, the different expansions on account of different coefficients of expansion being compensated by the adhesive layer. In addition, in the case in which the adhesive does not extend completely up to the periphery of the semiconductor device, the singulation process, i.e., the sawing technique, is not impaired.

The gap possibly forming in the boundary surface between the gold layer and the plastic package molding compound may serve at the same time as a moisture path, so that the mechanical decoupling advantageously results at the same time in the formation of a deliberately arranged moisture path for the moisture test.

To sum up, the following advantages of the invention can be stated:

1. The extended adhesive layer, or adhesive layer of increased surface area, mechanically decouples the semiconductor chip from the circuit substrate and thereby equalizes the different coefficients of expansion.

2. Deliberate gap formation allows the creation of a decoupling path, which is based on intentional worsening of the adhesion between the metal layers and the plastic package molding compound.

3. In the case of the semiconductor device according to the invention, an increased thermal cycling endurance is found.

4. Advantageous path formation for the moisture test is achieved.

5. Greater reliability for the semiconductor devices can be ensured.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
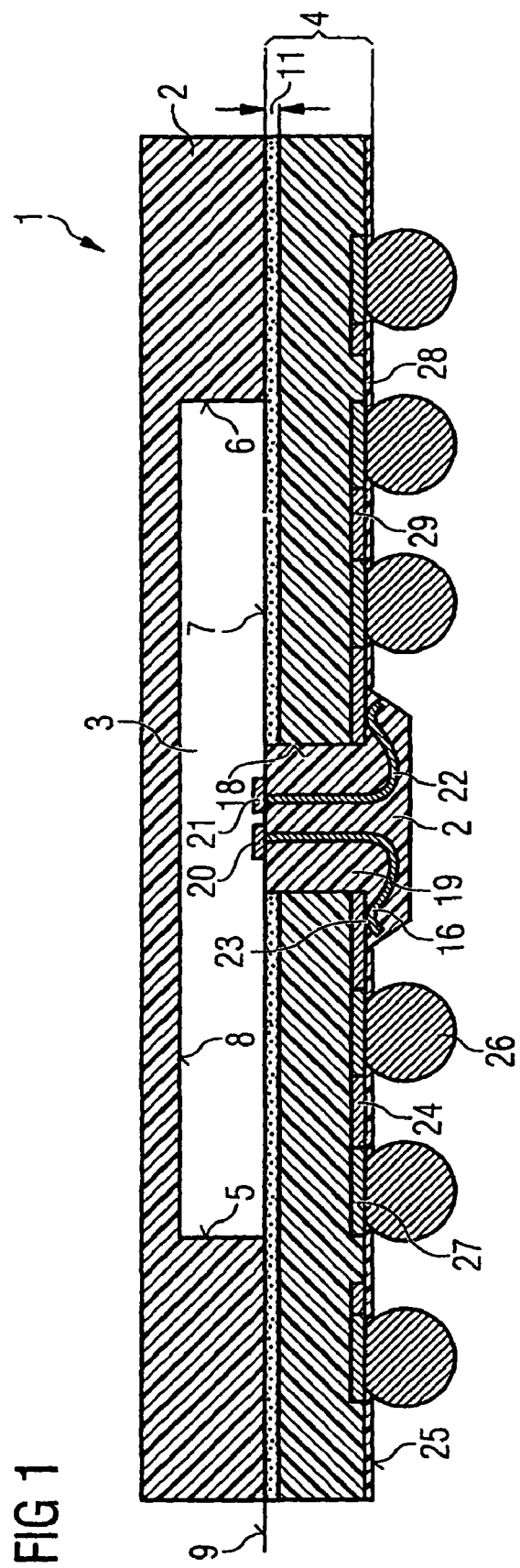
FIG. 1 illustrates a schematic cross section through a semiconductor device of a first embodiment of the invention.

FIG. 1 illustrates a schematic cross section through a semiconductor device 1 of a first embodiment of the invention. The semiconductor device 1 comprises two regions, which are held together by means of an elastic adhesive layer 11. The upper region of the semiconductor device 1 is arranged on the adhesive layer 11 and has a semiconductor chip 3, which is fixed on the adhesive layer 11 by its active upper side 7. Also arranged on the adhesive layer 11 is a plastic package molding compound 2, which embeds the peripheral sides 5 and 6 of the semiconductor chip 3 and the rear side 8 of the semiconductor chip 3. The adhesive layer 11 may be made up of a single layer of adhesive of a rubber-elastic material, or comprise a film which is coated with adhesive on both sides. The layer of adhesive may also be favorably printed or dispensed.

A film with layers of adhesive on both sides as the adhesive layer 11 has the advantage that it has fabrication advantages for the production of the exemplary embodiment shown in FIG. 1, since it can be reproducibly positioned on the leadframe 4 in such a way that an opening 18 in the leadframe 4 remains free. The second region of the semiconductor device 1 is formed in a leadframe 4, which bears the adhesive layer 11 on its upper side 9. On its rear side 25, the leadframe 4 has a wiring structure 24, which is partially covered by a layer of solder resist 28. The wiring structure 24 has wiring leads 29, external contact areas 27 and bonding fingers 23.

The bonding fingers 23 are arranged in the peripheral region of the central opening 18 on the rear side 25 of the leadframe 4, while the external contact areas 27, which are connected to the bonding fingers 23 by means of wiring leads 29, bear external contacts 26. The lower region with the leadframe 4 and the upper region with the semiconductor chip 3 in the plastic package molding compound 2 are electrically connected to each other by means of electrical connections 16. The electrical connections 16 have bonding wires 22, which are arranged in a bonding channel 19. These bonding wires 22 connect the rows of contact areas 20 and 21 on the active upper side 7 of the semiconductor chip 3 to the bonding fingers 23 on the rear side 25 of the leadframe 4.

The advantages of a continuous adhesive layer 11 for keeping such a device 1 together have been explained in detail above and, to avoid repetition, are not separately discussed at this point. Not only is the semiconductor chip 3 embedded in the plastic package molding compound 2, but also the bonding wires 22 are embedded in such a plastic molding compound by sealing the bonding channel 19 with the plastic package molding compound 2. No explanation of the method for producing such a semiconductor device 1 is given at this point either, especially since it has already been described above.

Figure 2:
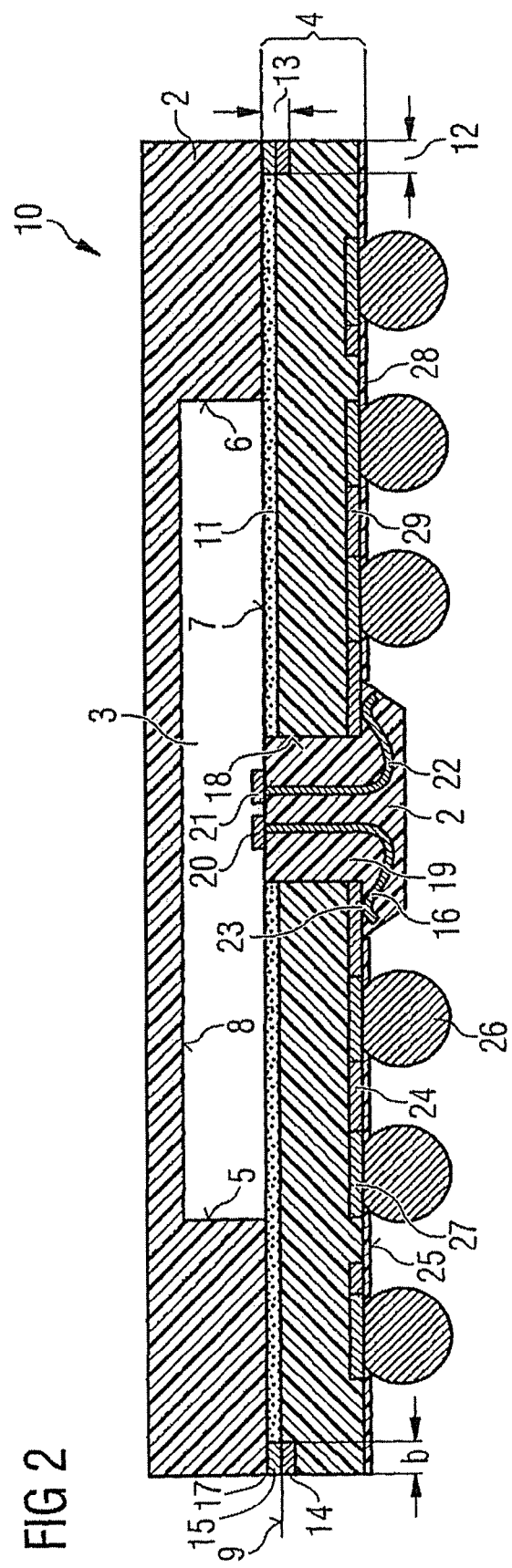
FIG. 2 illustrates a schematic cross section through a semiconductor device of a second embodiment of the invention.

FIG. 2 illustrates a schematic cross section through a semiconductor device of a second embodiment of the invention. Components with the same functions as in FIG. 1 are identified by the same designations and not separately explained.

The second embodiment of the invention according to FIG. 2 differs from the first embodiment of the invention according to FIG. 1 in that, instead of an adhesive layer 11, a metal layer 13 is arranged between the upper part of the semiconductor device 10 and the lower region of the semiconductor device 10 in the peripheral regions 12 of the semiconductor device 10. In this embodiment of the invention, this metal layer 13 comprises two components, that is a copper layer 14 on the leadframe 4 and a gold layer 15 applied on top of it.

The width b of the metal layer 13 is dimensioned in such a way that it is possible for a number of semiconductor devices 10 to be reliably divided from a panel along sawing tracks without an adhesive layer 11 being able to soil the dividing tool. The gold coating ensures that the adhesion of the plastic package molding compound 2 is reduced in the boundary layer between the material of the plastic package molding compound 2 and the gold coating, so that, in addition to the purely ductile compliance of the gold and copper layers 14, 15 of the metal layer 13, under extreme loading microgaps 17 can also form in the boundary layer, on the one hand permitting a moisture path via which moisture can escape from the semiconductor device 10, whereby the moisture test is improved, and on the other hand permitting compliance in the peripheral region, whereby improved reliability in thermal cycling tests is achieved.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device comprising:
    a plastic package molding compound;
    a semiconductor chip;
    a leadframe, the semiconductor chip being embedded in the plastic package molding compound, an upper side of the semiconductor chip and the plastic package molding compound are arranged on the leadframe; and
    an elastic adhesive layer being arranged between the plastic package molding compound and the leadframe, and between the semiconductor chip and the leadframe, configured for mechanical decoupling of an upper region from a lower region of the semiconductor device;
    wherein peripheral regions of the semiconductor device are free of the elastic adhesive layer and include a metal layer completely covering the leadframe in the peripheral regions of the semiconductor device and mechanically decoupling the plastic package molding compound from the leadframe.

2. The semiconductor device as claimed in claim 1, wherein the metal layer comprises a stack of elastic metal layers.

3. The semiconductor device as claimed in claim 1, wherein:
    the leadframe comprises a central opening and bonding fingers of a wiring structure on a rear side of the leadframe, the bonding fingers being arranged at the periphery of the central opening of the leadframe;
    wherein the semiconductor chip is applied with its active upper side to the adhesive layer and has contact areas being arranged in two rows over the central opening of the leadframe;
    and wherein the contact areas of the semiconductor chip and the bonding fingers of the leadframe are electrically connected to each other by means of bonding wires extending through the central opening of the leadframe.

4. The semiconductor device as claimed in claim 3, wherein the central opening is sealed with the plastic package molding compound.

5. A semiconductor device comprising:
    a plastic package molding compound;
    a semiconductor chip;
    a leadframe, the semiconductor chip being embedded with one of its two upper sides and its peripheral sides in the plastic package molding compound, and the other of its two upper sides being surface-mounted on an upper side of the leadframe, and the region of the upper side of the leadframe that is not covered by the semiconductor chip being covered by the plastic package molding compound; and
    a continuous elastic adhesive layer arranged between the plastic package molding compound and the leadframe, and between the semiconductor chip and the leadframe, on the upper side of the leadframe;
    wherein peripheral regions of the semiconductor device are free of the elastic adhesive layer and include a stack of metal layers completely covering the leadframe in the peripheral regions of the semiconductor device and mechanically decoupling the plastic package molding compound from the leadframe.

6. The semiconductor device as claimed in claim 5, comprising wherein the stack of elastic metal layers comprises a copper layer of a copper alloy arranged on the leadframe and a gold layer of a gold alloy applied on top of it.

7. The semiconductor device as claimed in claim 5, the metal layers comprise a copper layer of a copper alloy arranged on the leadframe and an aluminium layer of an aluminium alloy applied on top of it.

8. The semiconductor device as claimed in claim 5, comprising wherein the stack of elastic metal layers comprise a copper layer of a copper alloy arranged on the leadframe and a silver layer of a silver alloy applied on top of it.

9. The semiconductor device as claimed in claim 5, comprising wherein the width of the stack of elastic metal layers in the peripheral regions of the semiconductor device are adapted to the width of sawing tracks in such a way that the elastic adhesive layer is not exposed to the sawing process in the production of peripheral sides of the semiconductor device.

10. A panel, comprising:
a plastic package molding compound;
semiconductor chips;
a leadframe, the semiconductor chips being embedded in the plastic package molding compound, wherein an upper side of the semiconductor chips and the plastic package molding compound are arranged on the leadframe;
each semiconductor chip and a respective portion of the plastic package molding compound and of the leadframe forming a semiconductor device, the semiconductor devices being arranged in rows and columns; and
an elastic adhesive layer being arranged between the plastic package molding compound and the leadframe, and between the semiconductor chips and the leadframe, configured for mechanical decoupling of an upper region from a lower region of the semiconductor devices,
wherein peripheral regions of the semiconductor devices are free of the elastic adhesive layer and comprise a metal layer, the metal layer completely covering the leadframe in the peripheral regions of the semiconductor devices and mechanically decoupling the plastic package molding compound from the leadframe.

11. The panel as claimed in claim 10, wherein the metal layer comprises a stack of elastic metal layers.

12. A method for producing a panel with a plastic package molding compound, semiconductor chips and a leadframe in a number of semiconductor device positions, the method comprising:
producing a leadframe with device positions arranged in rows and/or columns;
applying an elastic adhesive layer, covering both the region of the intended semiconductor chip and the region of the intended plastic package molding compound on an upper side of the leadframe in the device positions;
adhesive attachment of semiconductor chips onto the adhesive layer in the device positions;
establishing electrical connections between contact areas of the semiconductor chip and the leadframe in the device positions;
applying a plastic package molding compound to the adhesive layer while embedding the semiconductor chips and while forming a panel with a number of semiconductor device positions; and
dividing up the panel into individual semiconductor devices along sawing tracks;
wherein a pattern of a metal layer is applied to the leadframe before the application of the adhesive layer, the pattern of the metal layer covering more than a width of the sawing tracks so that the adhesive layer is not exposed to the sawing process and mechanically decoupling the plastic package molding compound from the leadframe.

13. The method as claimed in claim 12, comprising wherein the pattern of the metal layer has a width in the range of 1.2 times to 3 times the width of the sawing tracks.

14. The method as claimed in claim 12, comprising wherein a central opening for a bonding channel is introduced in the device positions of the leadframe when the leadframe is produced.

15. The method as claimed in claim 12, comprising wherein the semiconductor chip is applied with its active upper side to the adhesive layer of the leadframe while aligning contact areas of the semiconductor chip arranged in two rows over the central opening of the leadframe, and bonding wires for connecting the contact areas of the semiconductor chip to bonding fingers of a wiring structure are attached on the rear side of the leadframe in the device positions.

16. The method as claimed in claim 12, wherein the pattern of the metal layer comprises a stack of elastic metal layers.

* * * * *